United States Patent [19]

Weidenauer et al.

[11] Patent Number: 4,700,879
[45] Date of Patent: Oct. 20, 1987

[54] METHOD FOR MANUFACTURING SEMICONDUCTOR POWER MODULES WITH AN INSULATED CONTRUCTION

[75] Inventors: Werner Weidenauer, Lampertheim; Bernd Leukel, Weinheim; Klaus Bunk, Worms, all of Fed. Rep. of Germany

[73] Assignee: Brown, Boveri & Cie AG, Mannheim, Fed. Rep. of Germany

[21] Appl. No.: 740,287

[22] Filed: Jun. 3, 1985

[30] Foreign Application Priority Data

Jun. 1, 1984 [DE] Fed. Rep. of Germany ....... 3420364
Apr. 16, 1985 [DE] Fed. Rep. of Germany ....... 3513530

[51] Int. Cl.⁴ .............................................. B23K 31/02
[52] U.S. Cl. .................................. 228/123; 228/124; 228/173.3; 228/187; 228/203; 228/215
[58] Field of Search ................... 228/123, 124, 173.3, 228/187, 203, 215; 29/832, 840

[56] References Cited

U.S. PATENT DOCUMENTS

| | | | |
|---|---|---|---|
| 3,150,446 | 9/1964 | Todd | 228/203 X |
| 3,339,008 | 8/1967 | MacArthur et al. | 228/215 X |
| 3,720,999 | 3/1973 | Nier | 29/840 X |
| 4,270,265 | 6/1981 | Ikeda et al. | 29/840 |
| 4,389,771 | 6/1983 | Cassidy et al. | 228/215 X |
| 4,409,278 | 10/1983 | Jochym | 228/124 X |

FOREIGN PATENT DOCUMENTS

| | | | |
|---|---|---|---|
| 2714483 | 10/1978 | Fed. Rep. of Germany | 228/180.2 |
| 2728330 | 1/1979 | Fed. Rep. of Germany | 228/180.2 |
| 55-45512 | 3/1980 | Japan | 228/203 |
| 1440545 | 6/1976 | United Kingdom | 228/123 |

Primary Examiner—Nicholas P. Godici
Assistant Examiner—Carmine Cuda
Attorney, Agent, or Firm—Herbert L. Lerner; Laurence A. Greenberg

[57] ABSTRACT

A method for manufacturing insulated semiconductor power modules includes: presoldering a plurality of semiconductor sandwiches and a carrier unit including a metal base plate, ceramic insulating discs and connecting tabs with a high-melting solder in a first step; joining the semiconductor sandwiches and the carrier unit together with a low-melting solder in a second step; performing the first and second soldering steps without flux in a gas from the group consisting of hydrogen and forming gas; and preventing a mixture of the high-melting solder and the low-melting solder during the second step.

13 Claims, 6 Drawing Figures

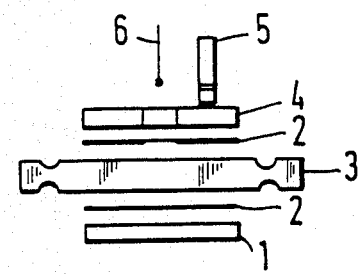
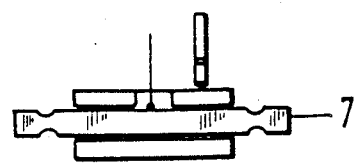
Fig.1a  Fig.1b
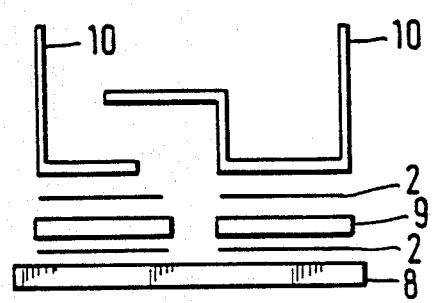
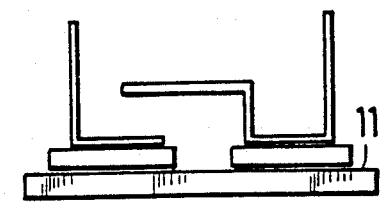
Fig.2a  Fig.2b
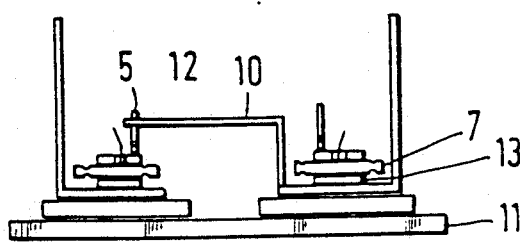
Fig.3

METHOD FOR MANUFACTURING SEMICONDUCTOR POWER MODULES WITH AN INSULATED CONTRUCTION

The invention relates to methods for manufacturing semiconductor power modules, wherein several parts of the module are joined together in several soldering steps using soft solder with different melting points, or at least one solder joint is made between a metal base plate and a ceramic insulating disc, and the base plate, a solder foil and the disc are disposed horizontally on top of each other and are brought to the melting temperature in an oven.

Semiconductor power modules of insulated construction are known, for instance, from German Design Patent DE-GB No. 75 13 432. Such semiconductor power modules are fabridated by soldering the parts in such a way that the soldering usually is carried out in several steps. Either a uniform solder is used for all of the steps, or the melting points of the solders used are graduated in decreasing order from the semiconductor chip to the base plate or metal bottom plate. In any case, PbSn63 solder material is used as the solder with the lowest melting point, while partly applying fluxes. This was shown by an investigation of the semiconductor power modules obtainable on the market, with insulated construction.

The solder material PbSn63 has a high tin content and therefore has a tendency to form intermetallic compounds, especially if silver-metallized parts are soldered with it. Critical solder joints, i.e., particularly large-area and thermally-stressed solder joints, can therefore become brittle. The solder joints have low alternating-load strength. Flux additives enhance this negative property.

In heavy-duty modules, different coefficients of expansion of the parts to be soldered together which are made of different materials, are strongly noticed. A relatively large solder layer thickness such as 100 $\mu$m is required, so that the soldered joints can compensate the given different material expansions. Thick solder layers are advantageous, especially between a relatively thick metal base plate and insulating plates made of ceramic which are to be soldered thereon. It has been found that such a metal-ceramic joint is difficult to make with a thick solder layer, since thick solder layers have the tendency to run out from the area of the intended solder joint and as a result the desired solder layer thickness which assures the required alternating-load strength is not achieved. In addition, void-like areas can occur, i.e., areas within a larger solder joint which are not wetted by solder material or are only thinly wetted. This decreases the amount of dissipation heat which can be removed as well as the alternating-load strength.

It is accordingly an object of the invention to provide a method for manufacturing semiconductor power modules, which overcomes the hereinafore-mentioned disadvantages of the heretofore-known devices of this general type, and which leads to modules with improved alternating-load strength.

With the foregoing and other objects in view there is provided, in accordance with the invention, a method for manufacturing insulated semiconductor power modules, wherein several parts of the module are joined together in several soldering steps, using soft solders with different melting points which comprises: presoldering a plurality of semiconductor sandwiches and a carrier unit including a metal base plate, ceramic insulating discs and connecting tabs or straps with a high-melting solder in a first step; joining the semiconductor sandwiches and the carrier unit together with a low-melting solder in a second step; performing the first and second soldering steps without flux in a gas from the group consisting of hydrogen or forming gas; and preventing a mixture of the high-melting solder and the low-melting solder during the second step by suitable construction and placement. This method has the advantage that, with a relatively minor change in the manufacturing method, high alternating-load strength is achieved for proven modules with a stable metal base plate which is known, for instance, from modules with metal-ceramic substrates fabricated by direct bonding. This is because a high-melting solder is used at the metal base plate in the method according to the invention. In addition, an advantageous production cycle is obtained, since larger parts of a module, i.e., semiconductor sandwiches and carrier units, are prefabricated in a parallel production line. It is furthermore advantageous that only two successive soldering operations are required since in each heating process, the structure of previously made solder joints is changed, even if the melting point of the solder material is not reached.

In accordance with another mode of the invention, there is provided a method which comprises selecting the high-melting solder with a melting point above 300° C.

In accordance with a further mode of the invention, there is provided a method which comprises selecting the high-melting solders from the group consisting of PbSn5 or PbAgSn.

In accordance with an added mode of the invention, there is provided a method which comprises selecting the low-melting solder as SnAg3.5.

In accordance with the objects of the invention there is provided a second method for manufacturing semiconductor power modules, with at least one solder joint between a metal base plate and a ceramic insulating disc or washer, which comprises forming an assembly by initially roughening the upper surface of a metal base plate, placing a solder foil horizontally on top of the roughened surface and placing a ceramic insulating disc or washer horizontally on top of the solder foil, and heating the assembly to the melting temperature of the solder foil in an oven. This method has the advantage that due to the roughness of the metal base, the solder material does not run out of the area of the solder joint and in addition, uniform wetting is achieved.

In accordance with again another mode of the invention, there is provided a method which comprises selecting an area of the upper surface of the metal base plate for a solder joint, and performing the roughening step only in the selected area.

In accordance with the invention, there is furthermore provided a method for manufacturing insulated semiconductor power modules, wherein several parts of the module are joined to each other in several soldering steps, using soft solder with different melting points, which comprises: roughening the upper surface of a metal base plate in a first step; presoldering a plurality of semiconductor sandwiches and a carrier unit including the metal base plate, ceramic insulating discs or washers and connecting straps or tabs with a high-melting solder in a second step; joining the semiconductor sandwiches and the carrier unit together with a low-melting solder in a third step; performing the soldering operations in the second and third steps without flux in a gas from the group consisting of hydrogen or forming gas; and preventing mixing of the high-melting solder and the low-melting solder in the third step by appropriate construction and placement. This method is an advantageous supplement of the two-stage soldering process mentioned initially above, by using the second method for improving the soldering to the metal base plate.

In accordance with again a further mode of the invention, there is provided a method which comprises roughening the upper surface of the metal base plate to a roughness of substantially 6 to 50 μm or preferably 6 to 20 μm.

In accordance with a concomitant mode of the invention, there is provided a method which comprises roughening the upper surface of the metal base plate by sand blasting, grinding, embossing depressions or by forming coarse and fine depressions.

Other features which are considered as characteristic for the invention are set forth in the appended claims.

Although the invention is illustrated and described herein as embodied in a method for manufacturing semiconductor power modules with an insulated construction, it is nevertheless not intended to be limited to the details shown, since various modifications may be made therein without departing from the spirit of the invention and within the scope and range of equivalents of the claims.

The invention, however, together with additional objects and advantages thereof will be best understood from the following description when read in connection with the accompanying drawings, in which:

FIG. 1a is a diagrammatic, side-elevational view showing parts of a semiconductor sandwich;

FIG. 1b is a side-elevational view of a soldered semiconductor sandwich;

Figure 4:
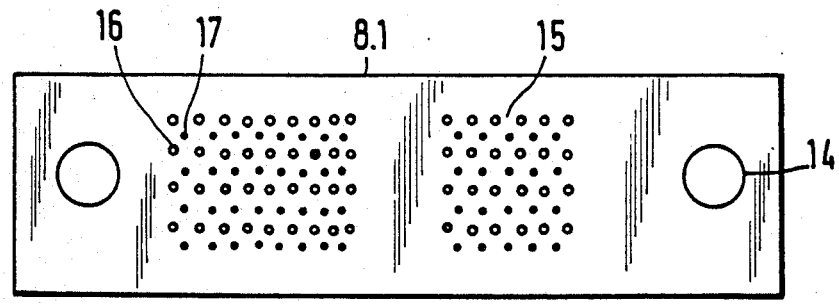

FIG. 2a a is a side-elevational view showing parts of a carrier unit;

FIG. 2b is a side-elevational view of a soldered carrier unit;

FIG. 3 is a side-elevational view of a combination of a carrier unit with two semiconductor sandwiches; and FIG. 4 is a top-plan view of a metal base plate with roughened surfaces.

Referring now to the figures of the drawings in detail, it is seen that FIGS. 1a to 3 relate to a first method according to the invention and FIG. 4 relates to a second method according to the invention. A third method according to the invention is shown in all of the figures, since the metal base plate 8 shown in FIG. 2a should be regarded as being replaced by the metal base plate 8.1 shown in FIG. 4.

FIG. 1a shows the parts required for the first method of manufacturing a semiconductor sandwich 7 which is seen in the assembled condition in FIG. 1b. As seen from the bottom toward the top, the sandwich 7 includes the following parts: a lower compensating disc 1 which may be formed of molybdenum or Vacon, a high-melting solder 2 in the form of a platelet, a silicon semiconductor chip 3, a high-melting solder 2 in the form of an annular platelet, an upper compensating disc 4 which is connected to a cathode stem 5 by hard-soldering, and a copper wire 6 which has been previously covered with solder, for a control terminal. The parts are inserted into a soldering form and are soldered in hydrogen or a forming gas. PbSn5 or PbAgSn, for instance, can be used as the high-melting solder 2.

FIG. 1b shows the finished, soldered semiconductor sandwich 7 which is formed of the parts 1 to 6 shown in FIG. 1a.

FIG. 2a shows the details of a carrier unit 11 shown in the assembled condition in FIG. 2b. A metal base plate 8 formed of nickel-plated copper has the following parts disposed thereon: a high-melting solder 2 in the form of a platelet, ceramic insulating platelets or discs 9 which may be formed of $Al_2O_3$ or BeO with a thin-film metallization of MoMgNiAu or WoNiAu or another metallization fabricated by direct bonding, a high-melting solder 2 in the form of a platelet, and straps or tabs 10 which may be formed of silver-plated or nickel-plated copper. These parts are also inserted into a soldering form and soldered in hydrogen or a forming gas. FIG. 2b shows the finished, soldered carrier unit 11 which includes the parts 2 and 8 to 10 shown in FIG. 2a.

After the first manufacturing step, in which semiconductor sandwiches 7 and carrier units 11 are manufactured in parallel production operations, a combination of the parts 7, 11 is made in a second step. To this end, as shown in FIG. 3, for instance, two semiconductor sandwiches 7 are inserted into a carrier unit 11, with the interposition of low-melting solder 13 in the form of platelets. SnAg 3.5 with a melting point of about 230° C. can be used as the low-melting solder 13. The soldering process is carried out in hydrogen or a forming gas. The platelets of low-melting solder 13 are constructed in such a manner that no contact with the high-melting solder 2 occurs during the second manufacturing step, as far as possible. A solder mixture into PbSn63 is therefore avoided. Otherwise, the use of low-melting solder 13 at this point is less critical with respect to the alternating-load stress. The critical points are the large-area solder joints between the tab 10 and the insulating platelet 9, between the insulating platelet 9 and the metal base plate 8, as well as the thermally stressed solder joints between the silicon semiconductor chip 3 and the compensating discs 1,4, all of which are soldered with high-melting solder 2. A joint 12 between the tab 10 and the cathode stem or plunger 5 is made in a later operation in which the non-illustrated connections to external terminals are also made.

A second method which is suitable for making a metal-ceramic joint with a relatively thicker solder layer, for instance 100 μm, will be explained with reference to FIG. 4.

FIG. 4 shows a top-plan view onto the upper surface of a metal base plate 8.1 with mounting holes 14 and roughened areas 15 which are provided for solder joints. The roughening could also extend to the entire upper surface of the metal base plate 8.1. However, problems could arise if a plastic housing is cemented on the rim of the surface of the metal base plate. Preferably, therefore, the roughening is only provided in the area of the surfaces 15 provided for a solder joint.

A suitable roughness is about 6 to 50 μm, and a roughness of 6 to 20 μm, is preferred. The roughness can be produced in different ways. A highly suitable roughness of, for instance, 10 μm can be achieved by sand blasting. It has been found during tests that the approximately dot-shaped depressions produced thereby with somewhat different depths, are particularly well suited for the invention. However, producing rough surfaces by sand blasting requires a further operation for removing sand residues from the surface.

Grinding can be considered as a further possibility for producing a roughness of 20 μm, for instance. A surface structure which approximately corresponds to roughening by sand blasting can also be produced by embossing. In this way, a defined roughness of up to about 50 μm can be achieved. Roughening by embossing relatively coarse depressions 16 as well as fine deoressions 17 is possible as well as a combination of coarse and fine depressions 16, 17, which is shown in FIG. 4. The coarse and fine depressions 16, 17 can be made simultaneously or successively. Contrary to sand-blasting, a post-treatment is not necessary.

The method for making a metal-ceramic joint with a relatively thick solder layer and therefore a high alternating-load strength according to the invention, includes the following steps:

(a) fabricating a metal plate 8.1 with at least one roughened surface 15;
(b) placing a solder foil 2 on the roughened surface 15;
(c) placing a ceramic platelet or disc 9 on the solder foil; and
(d) heating the assembly to the soldering temperature and letting it cool down again.

This third method, explained with the aid of FIG. 4, can advantageously be combined with the method described with the aid of FIGS. 1a to 3 above, for fabricating a module in two soldering steps. As already mentioned above, a metal base plate 8.1 with a roughened surface 15 is used in this case instead of a metal base plate 8 with a smooth surface.

The foregoing is a description corresponding in substance to German Applicantion Nos. P 34 20 364.8, filed June 1, 1984 and No. P 35 13 530.1, filed Apr. 16, 1985, the International priority of which is being claimed for the instant application and which is hereby made part of this application. Any material discrepancies between the foregoing specification and the aforementioned corresponding German Application No. P 34 20 364.8, filed June 1, 1984, are to be resolved in favor of the latter.

We claim:

1. Method for manufacturing insulated semiconductor power modules, which comprises: presoldering a plurality of semiconductor sandwiches and a carrier unit including a metal base plate, ceramic insulating discs and connecting tabs with a high-melting solder in a first step; joining the semiconductor sandwiches and the carrier unit together with a low-melting solder in a second step; performing the first and second soldering steps without flux in a gas from the group consisting of hydrogen and forming gas; and preventing a mixture of the high-melting solder and the low-melting solder during the second step.

2. Method according to claim 1, which comprises selecting the high-melting solder with a melting point above 300° C.

3. Method according to claim 1, which comprises selecting the high-melting solder from the group consisting of PbSn5 and PbAgSn.

4. Method according to claim 1, which comprises selecting the low-melting solder as SnAg 3.5.

5. Method for manufacturing insulating semiconducting power modules, which comprises selecting an area of the upper surface of a metal base plate for a solder joint and roughening the upper surface of the metal base plate only in the selected area in a first step; presoldering a plurality of semiconductor sandwiches and a carrier unit including the metal base plate, ceramic insulating discs and connecting tabs with a high-melting solder in a second step; joining the semiconductor sandwiches and the carrier unit together with a low-melting solder in a third step; performing the soldering operations in the second and third steps without flux in a gas from the group consisting of hydrogen and forming gas; and preventing mixing of the high-melting solder and the low-melting solder in the third step.

6. Method for manufacturing semiconductor power modules, which comprises forming an assembly by initially selecting an area of the upper surface of a metal base plate for a solder joint, roughening the upper surface of the metal base plate only in the selected area, placing a solder foil horizontally on top of the roughened surface and placing a ceramic insulating disc horizontally on top of the solder foil, and heating the assembly to the melting temperature of the solder foil in an oven.

7. Method for manufacturing insulated semiconductor power modules, which comprises: unevenly roughening the upper surface of a nickel-plated base plate in a first step; presoldering a plurality of semiconductor sandwiches and a carrier unit including the nickel-plated base plate, ceramic insulating discs and connecting tabs with a high-melting solder in a second step; joining the semicondutor sandwiches and the carrier unit together with a low-melting solder in a third step; performing the soldering operations in the second and third steps without flux in a gas from the group consisting of hydrogen and forming gas; and preventing mixing of the high-melting solder and the low-melting solder in the third step.

8. Method according to claim 7, which comprises roughening the upper surface of the nickel-plated base plate to a roughness of substantially 6 to 50 μm.

9. Method according to claim 7, which comprises roughening the upper surface of the nickel-plated base plate to a roughness of substantially 6 to 20 μm.

10. Method according to claim 7, which comprises roughening the upper surface of the nickel plated base plate by sand blasting.

11. Method according to claim 7, which comprises roughening the upper surface of the nickel-plated base plate by grinding.

12. Method according to claim 7, which comprises roughening the upper surface of the nickel-plated base plate by embossing depressions.

13. Method according to claim 7, which comprises roughening the upper surface of the nickel-plated base plate by forming coarse and fine depressions.

* * * * *